United States Patent [19]

Marui

[11] Patent Number: 5,387,794
[45] Date of Patent: Feb. 7, 1995

[54] DETECTOR FOR DIFFRACTED ELECTRONS

[75] Inventor: Takao Marui, Kanagawa, Japan

[73] Assignee: Shimadzu Corporation, Kyoto, Japan

[21] Appl. No.: 178,693

[22] Filed: Jan. 10, 1994

[30] Foreign Application Priority Data

Jan. 18, 1993 [JP] Japan .................................. 5-005543

[51] Int. Cl.⁶ .............................................. H01J 37/28
[52] U.S. Cl. ...................................... 250/310; 250/311
[58] Field of Search ........................ 250/306, 310, 311

[56] References Cited

U.S. PATENT DOCUMENTS

| | | | |
|---|---|---|---|
| 3,835,246 | 9/1974 | Müller et al. | 250/311 |
| 4,211,924 | 7/1980 | Müller et al. | 250/311 |
| 4,514,629 | 4/1985 | Smith | 250/311 |
| 4,602,282 | 7/1986 | Kurono et al. | 358/110 |
| 5,013,915 | 5/1991 | Isakozawa et al. | 250/311 |
| 5,093,573 | 3/1992 | Mikoshiba et al. | 250/310 |

*Primary Examiner*—Bruce C. Anderson
*Attorney, Agent, or Firm*—Heller, Ehrman, White & McAuliffe

[57] ABSTRACT

A detector for electrons diffracted by a sample irradiated with an electron beam uses a fluorescent screen to output optical signals representing the diffraction pattern formed by the diffracted electrons, and a TV camera to convert these optical signals to electrical signals. A photoelectric converter is used to determine the brightness of each position on the fluorescent screen but its position is controlled such that the converter will not obstruct the view of the fluorescent screen from the TV camera. Coordinate data on the positions at which the measured brightness is greater than a specified standard brightness value may be stored and relied upon in moving the photoelectric converter, or the light-receiving end of an optical fiber connected thereto, relative to the fluorescent screen.

20 Claims, 4 Drawing Sheets

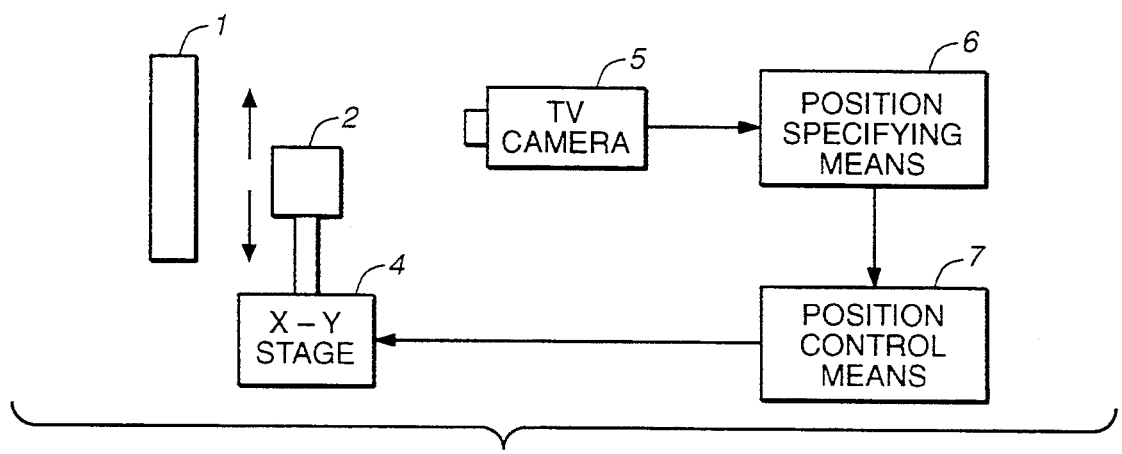
FIG._1
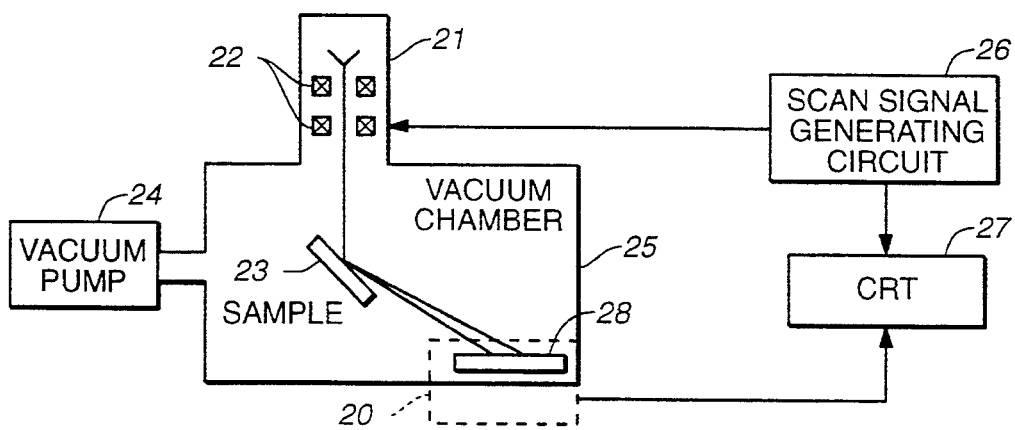
FIG._2
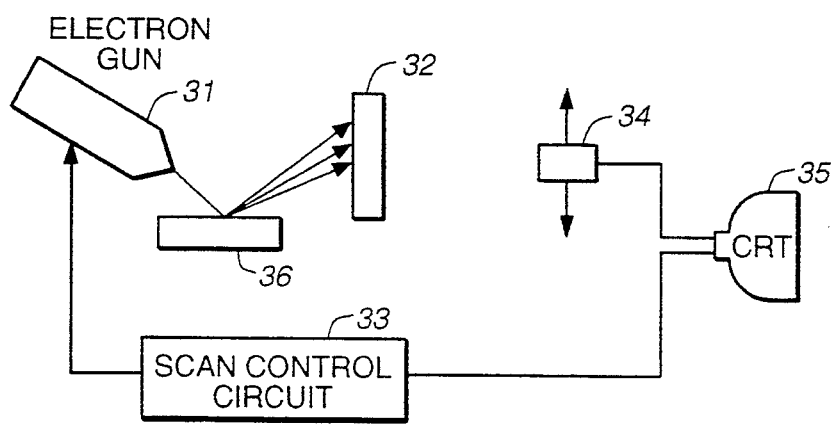
FIG._3
(PRIOR ART)

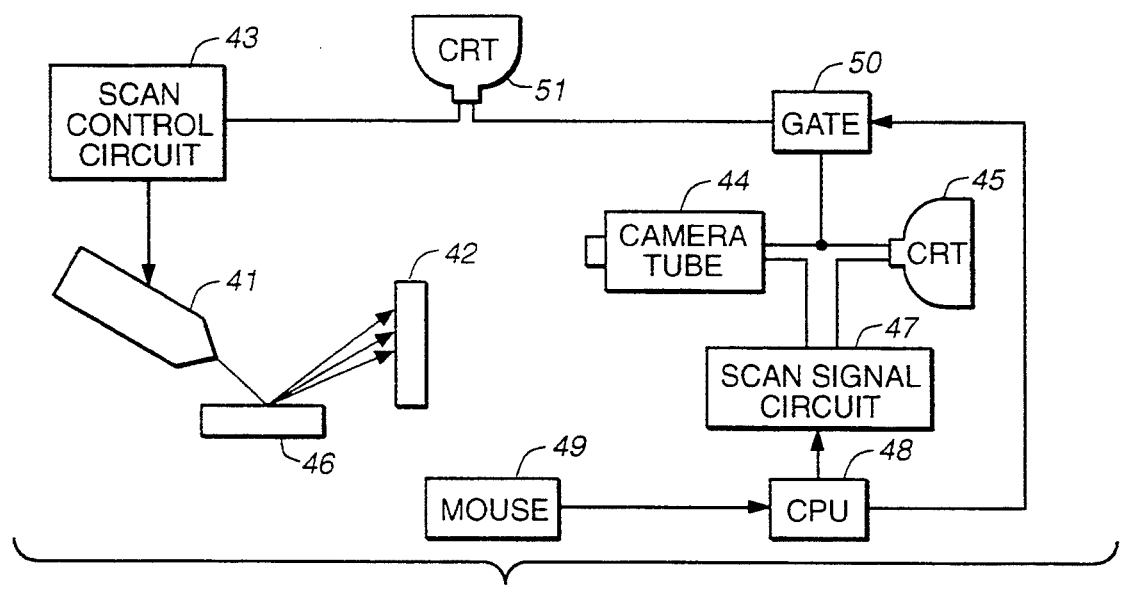
FIG._4
(PRIOR ART)
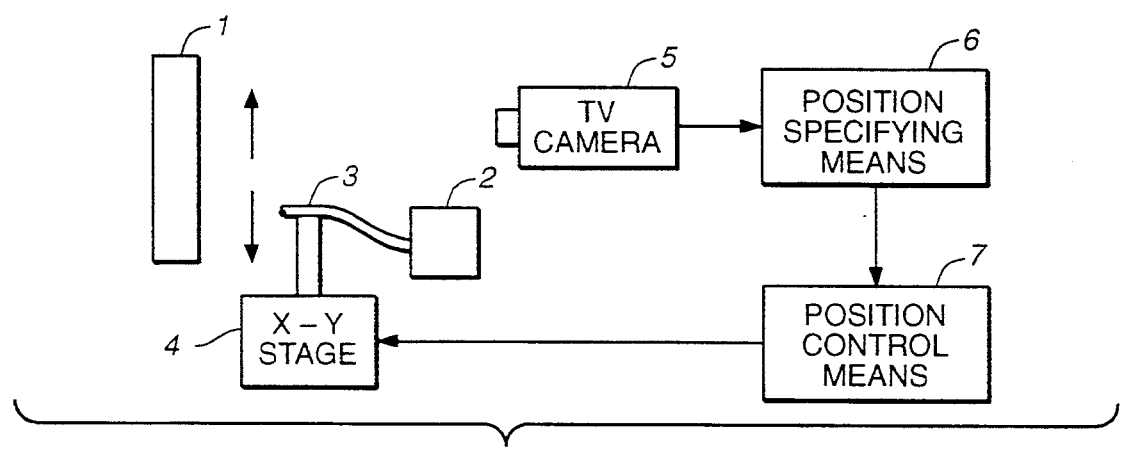
FIG._5
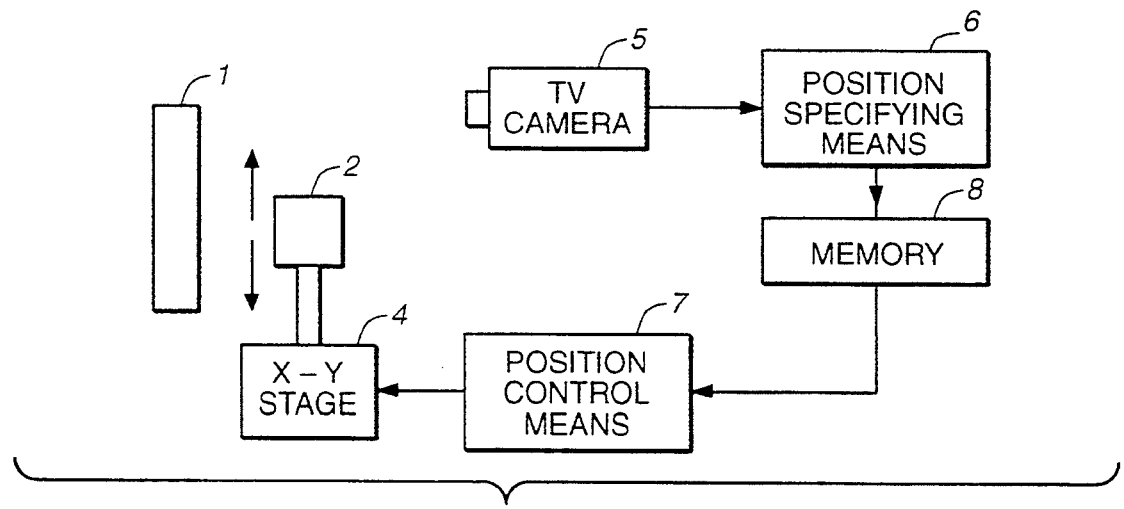
FIG._6

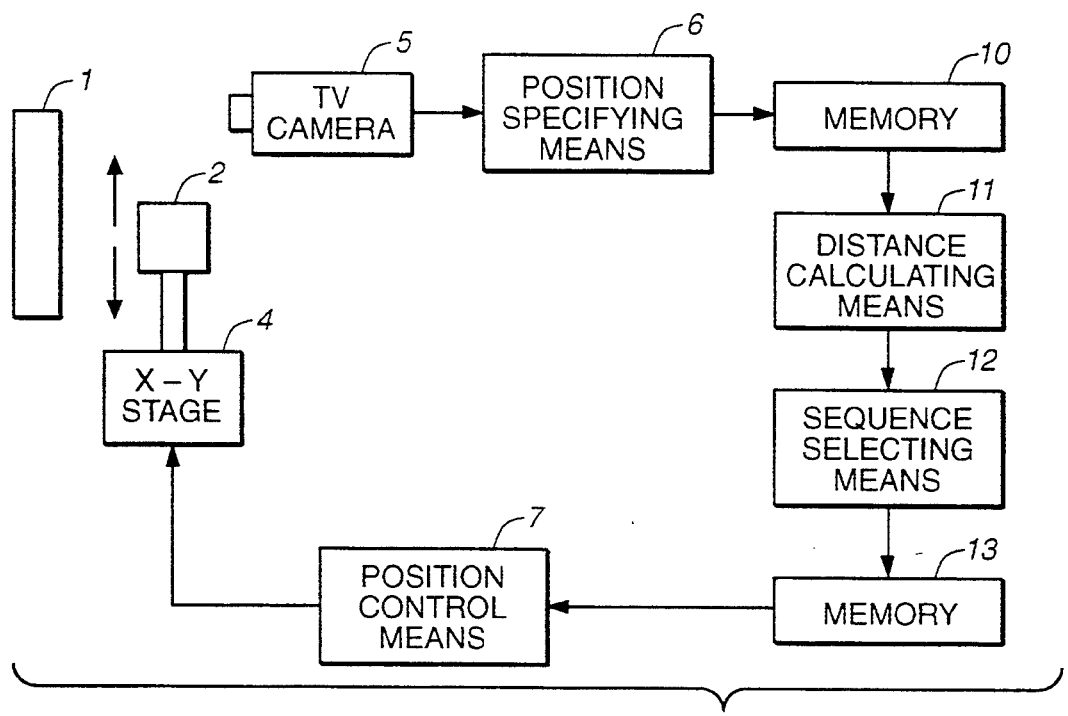
FIG._7
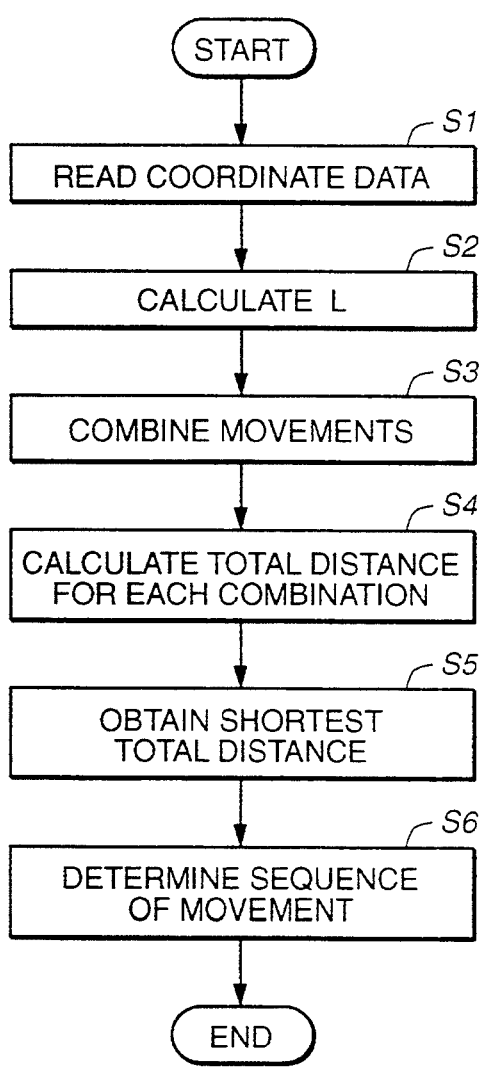
FIG._8
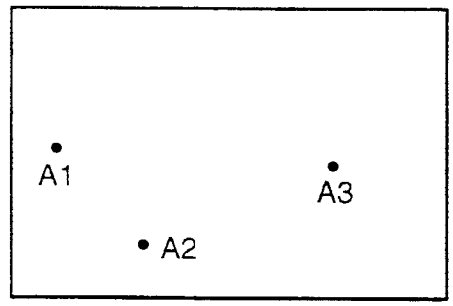
FIG._9

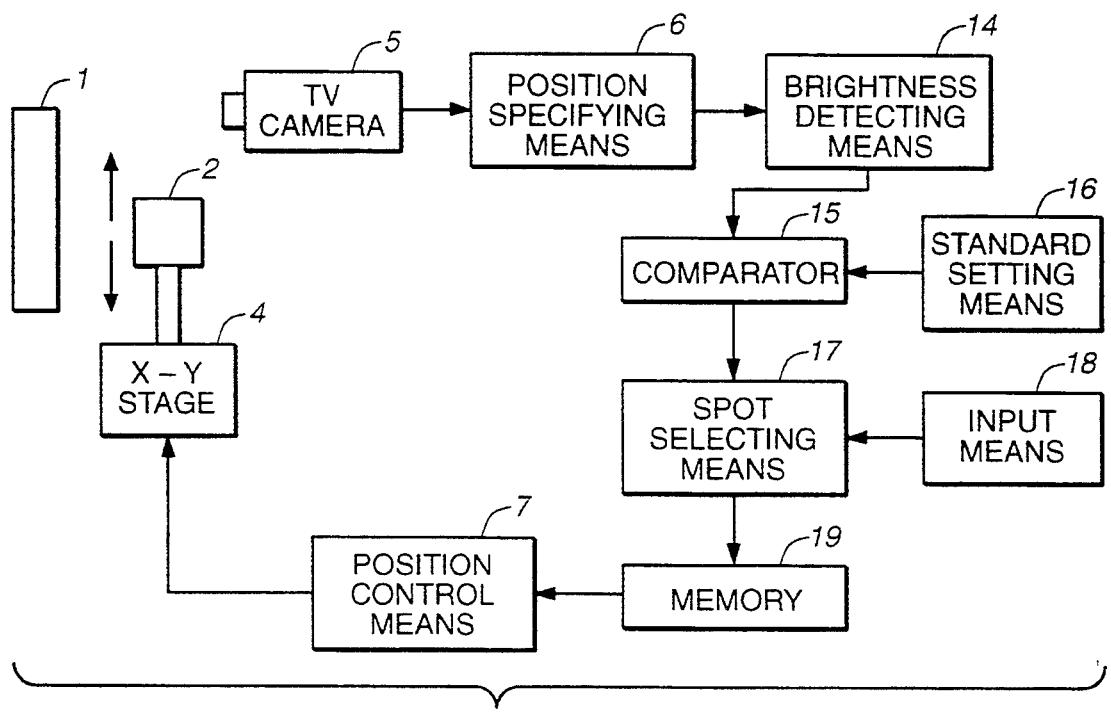
FIG._10
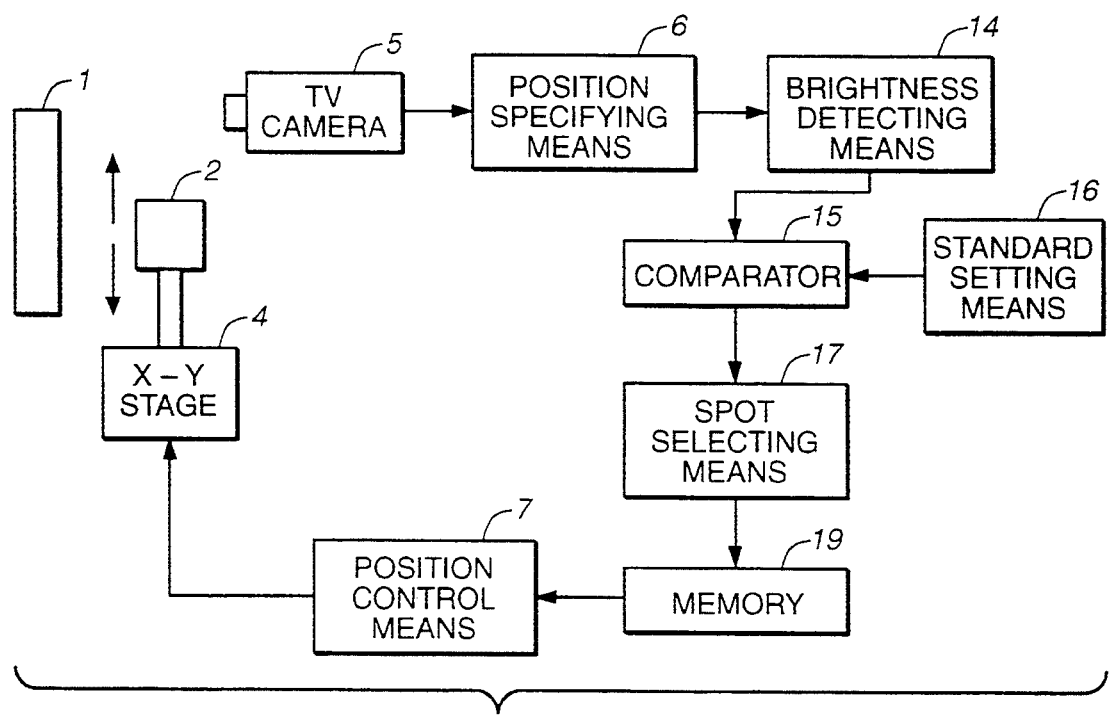
FIG._11

DETECTOR FOR DIFFRACTED ELECTRONS

BACKGROUND OF THE INVENTION

This invention relates to a detector for diffracted electrons for analyzing the signal intensity of diffraction spots with an electron diffraction detector.

When a crystal surface is irradiated by an electron beam, the beam is generally diffracted by the surface. The diffracted electrons form a pattern, but different diffraction patterns are formed if the direction of the crystal is changed with respect to the direction of incidence of the electron beam.

The fact that the positions of diffraction spots comprising a diffraction image (or pattern) change with the scanning by the electron beam indicates that the directions of crystal grains are different at each portion of the sample surface. Thus, by examining whether a diffraction spot appears or not at a certain position as different areas of a sample surface are scanned, it is possible to detect the shape and distribution of crystal grains in the direction which satisfies corresponding conditions for the diffraction.

There have therefore been known detectors for diffracted electrons using this principle to detect the shapes and distributions of crystal grains in a given sample. FIG. 3 shows a first example of such a prior art detector. As shown in FIG. 3, an electron beam emitted from an electron gun 31 is incident on a sample 36, and the electron beam diffracted by the surface of the sample 36 forms a diffraction pattern on a fluorescent screen 32. In order to study the differences in the diffraction pattern at different positions on the sample surface, the electron beam is moved around by means of a scan control circuit 33. A diffraction spot is selected by moving a detector 34 while observing the diffraction pattern formed on the fluorescent screen 32 either directly or by means of a TV camera. An image for showing the distribution of crystal grains can be obtained by displaying on a CRT 35 an on-line image of signal from the detector in synchronism with the electron beam scan.

FIG. 4 shows another prior art detector for diffracted electrons disclosed, for example, in Japanese Patent Publication Tokkai 4-204361. As illustrated in FIG. 4, an electron beam narrowly restricted by an electron gun 41 is made incident on a sample 46 nearly parallel to its surface, and the electrons which are diffracted by this surface are caused to collide with a fluorescent screen 42. The electron beam is converted into optical signals on the screen 42 and forms a diffraction pattern. A camera tube 44 scans this diffraction pattern according to scan signals received from a scan signal circuit 47, and image signals thus obtained are displayed on a cathode ray tube (CRT) 45. In order to set the position of a diffraction spot, an operator specifies the position of any picture element on the diffraction pattern by using a mouse 49 and a CPU 48. The scan timing for image signals corresponding to the picture element at the specified position is obtained by the CPU 48. Numeral 50 indicates a gate which is opened at this scan timing such that bright signals of the specified diffraction spot are extracted from image signals of the camera tube 44 and sent to another CRT 51. The CRT 51 uses these brightness signals in synchronism with scan signals from a scan control circuit 43 to thereby display an image showing the distribution of crystal grains.

There are problems, however, associated with such prior art detectors for diffracted electrons. With a detector of the type described above with reference to FIG. 3, for example, it is difficult to accurately match the detector with the position of a diffraction spot. In order to "catch" a desired diffraction spot, the detector 34 of FIG. 3 is usually moved in front of the fluorescent screen 32. During such a maneuver, either the detector 34 itself or a mechanism for moving it (not shown) is likely to cover the diffraction pattern formed on the fluorescent screen 32, interfering with its observation, say, by a TV camera (not shown) and making it difficult to align the detector 34 with a diffraction spot or to check its alignment.

With a detector of the type described above with reference to FIG. 4, on the other hand, the scanning time per picture element by the electron beam is limited by the time of scanning one image screen by the camera tube. In other words, since signals corresponding to the brightness of a specified diffraction spot are displayed by extracting signals at a rate of timing corresponding to the position of the specified picture element and synchronizing these extracted signals with the scanning of the sample surface by the electron beam, the speed of scanning the sample by the electron beam is set by the timing of extracting the image signals. The timing of extracting image signals is the same as the rate of scanning one image screen by the camera, and it is once every 1/30 second in the case of an ordinary TV camera. In other words, the time for the electron beam to scan one picture element is limited by this rate, and the scanning speed of the electron beam could not be increased.

SUMMARY OF THE INVENTION

It is therefore an object of the invention to eliminate these problems of prior art devices and to provide an improved detector for diffracted electrons with which diffraction spots can be specified accurately and easily.

It is another object of the invention to provide such a detector capable of continuously detecting signals indicating the brightness of specified diffraction spots so as to allow a high-speed scan of an electron beam.

A detector for diffracted electrons embodying the invention, with which the above and other objects can be accomplished, may be characterized as a detector for detecting electron beams diffracted by a sample irradiated by an electron beam, comprising a fluorescent screen for converting the diffracted electron beam into optical signal-s, camera means for photographing the fluorescent screen, detecting means for detecting brightness of a spot on the fluorescent screen, moving means for moving the detecting means for allowing detection of spots at different positions on the fluorescent screen, position specifying means for specifying a position on the fluorescent screen according to image signals from the camera means, and position control means for controlling the moving means according to coordinate data specified by the position specifying means-. The detecting means for detecting brightness of a spot on the fluorescent screen may comprise a photoelectric converter or optical fibers connected to a photoelectric converter. The device may further include memory means for storing coordinate data on a plurality of positions specified by the position specifying means.

With a device structured as described above, the detecting means can be moved by the moving means such as an X-Y stage without covering the fluorescent screen. An operator can select a desired diffraction spot by means of the position specifying means while observing an image photographed by the camera means such as a TV camera. Moreover, the position of such a diffraction spot can be caused to be outputted from the position specifying means as coordinate data, and the detecting means can be moved by the position control means relying on the coordinate data to a position where the brightness of the desired diffraction spot is to be observed. Thus, signals accurately corresponding to the brightness of a desired diffraction spot can be outputted from the photoelectric converter.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a block diagram of a detector for diffracted electrons according to a first embodiment of the invention;

FIG. 2 is a block diagram of a scan-type reflecting electron diffraction microscope using a detector of the present invention;

FIG. 3 is a block diagram of a prior art detector for diffracted electrons;

FIG. 4 is a block diagram of another prior art detector for diffracted electrons;

FIG. 5 is a block diagram of a detector for diffracted electron according to a second embodiment of the invention;

FIG. 6 is a block diagram of a detector for diffracted electron according to a third embodiment of the invention;

FIG. 7 is a block diagram of a detector for diffracted electron according to a fourth embodiment of the invention;

FIG. 8 is a flow chart for the sequence selecting means of FIG. 7;

FIG. 9 is an example of a pattern shown on the fluorescent screen of the detector of FIG. 7;

FIG. 10 is a block diagram of a detector for diffracted electron according to a fifth embodiment of the invention; and FIG. 11 is a block diagram of a detector for diffracted electron according to a sixth embodiment of the invention;

In these figures, components that are mutually the same or substantially alike, such as the fluorescent screen and the photoelectric converter, are indicated by the same numerals.

DETAILED DESCRIPTION OF THE INVENTION

Next, the invention is described by way of examples with reference to the drawings.

In FIG. 1 which shows a detector for diffracted electrons embodying the invention, numeral 1 indicates a fluorescent screen, numeral 2 indicates a photoelectric converter, numeral 4 indicates a stage adapted to move two-dimensionally in a plane (known as an X-Y stage), numeral 5 indicates a TV camera, numeral 6 indicates a position specifying means, and numeral 7 indicates a position control means. In FIG. 2 which shows a scan-type reflecting electron diffraction microscope, numeral 20 indicates a detector for diffracted electrons such as the one shown in FIG. 1, numeral 21 indicates an electron gun, numeral 22 indicates a scan coil, numeral 23 indicates a sample, numeral 24 indicates a vacuum pump, numeral 25 indicates a vacuum chamber, numeral 26 indicates a scan signal generating circuit, numeral 27 indicates a cathode ray tube (CRT), and numeral 28 indicates a fluorescent screen.

With reference first to FIG. 2, the sample 23 is placed inside the vacuum chamber 25 and irradiated with an electron beam from the electron gun 21. The incident electron beam is diffracted by the surface of the sample 23 and a diffraction pattern is formed on the fluorescent screen 28. A low-pressure condition inside the vacuum chamber 25 is prepared by means of the vacuum pump 24, and the scanning by the electron beam emitted from the electron gun 21 is controlled by the scan coil 22 according to scan signals from the scan signal generating circuit 26. The diffraction pattern formed on the fluorescent screen 28 is detected by the detector 20 embodying the present invention and detection signals therefrom are used as brightness signals for the CRT 27. Signals from the scan signal generating circuit 26 are also being received by the CRT 27.

As shown in FIG. 1, the diffraction pattern formed on the fluorescent screen 1 (shown in FIG. 2 at 28) is detected by two detecting means. One of the detecting means is for observing the pattern as a whole and may include the TV camera 5. The other is for analyzing the brightness of diffraction spots on the fluorescent screen 1 and may include the photoelectric converter 2. The TV camera 5 is placed behind the fluorescent screen 1 and serves to convert the entire pattern image thereon into image signals and to input them into the position specifying means 6. The position specifying means 6 is adapted to specify the position of a point on the image formed by the TV camera and to output the coordinate data for the specified position. An operator, who observes the diffraction pattern on the fluorescent screen 1 as taken by the TV camera 5, may select a diffraction spot to be analyzed and specify the selected diffraction spot by means of the position specifying means 6. The coordinate data of this specified diffraction spot are used by the position control means 7 for positioning the other detecting means to be described below.

The photoelectric converter 2, constituting the other detecting means, is disposed behind the fluorescent screen 1 and in front of the TV camera 5, serving to convert the brightness of a diffraction spot on the fluorescent screen 1 into electrical signals and to output them into a brightness data receiving means (not shown). The operator can continuously detect the brightness of a diffraction spot through these electrical signals.

The X-Y stage 4 is provided for positioning the photoelectric converter 2 adjacent a specified position (such as a diffraction spot) on the fluorescent screen 1. The X-Y stage 4 is driven by the position control means 7 so as to move the photoelectric converter 2 relative to the fluorescent screen 1. The position control means 7 controls this motion according to the position data on a target position received from the position specifying means 6.

With the detector thus organized, a diffraction spot to be analyzed is selected by means of the TV camera 5. The coordinate data of this selected diffraction spot are specified by and outputted from the position specifying means 6, and the X-Y stage 4 is operated according to these coordinate data to move the photoelectric converter 2 to the specified position. Operations of the detector thereafter are the same as those of a prior art detector and hence will not be described herein. With a detector as described above, the view of the fluorescent screen from the TV camera can be prevented from becoming obstructed by the photoelectric converter 5 because the motion, and hence the position, of the photoelectric converter can be controlled by a control means so as not to be in the way of the TV camera when the target position is selected on the fluorescent screen or its coordinate data are determined. Since two mutually independent detecting means are used to select a diffraction spot to be analyzed on the fluorescent screen and to detect the brightness of the selected spot, furthermore, signals indicative of the brightness can be received continuously and this has the desirable effect of improving the scan rate of the electron beam. Another advantage to be gained by the detector according to the present invention is its easy maneuverability because its X-Y stage is adapted to be operated by the position control means on the basis of coordinate data specified through the position specifying means.

FIG. 5 shows another detector for diffracted electrons according to a second embodiment of the invention, characterized as being similar to the one shown in FIG. 1 but different in that there is an optical fiber 3 (serving as an elongated flexible light-conducting means) with its light-receiving end disposed behind the fluorescent screen 1 and the other end connected to the photoelectric converter 2. The light-receiving end is for receiving optical signals from the fluorescent screen 1. The optical signals thus received are transmitted through the optical fiber 3 to the photoelectric converter 2. The photoelectric converter 2 is adapted to detect the brightness of diffraction spots on the fluorescent screen 1, transmitted through the optical fiber 3, but is positioned so as not to be in the way of the TV camera 5 viewing the fluorescent screen 1. The optical fiber 3 is movable by the X-Y stage 4, controlled by the position control means 7 according to coordinate data. In other aspects, detectors according to the second embodiment of the invention can be operated similarly as described above with reference to FIG. 1. The advantage of detectors according to the second embodiment of the invention is that the X-Y stage moves an optical fiber, not a photoelectric detector, and hence that the moving component can be made smaller and lighter.

FIG. 6 shows still another detector for diffracted electrons according to a third embodiment of the invention, which is different from the detector described above with reference to FIG. 1 in that there is a memory means 8 connected between the position specifying means 6 and the position control means 7. With a detector according to this embodiment of the invention, a plurality of positions for analysis on the fluorescent screen 1 can be specified for the photoelectric converter 2 such that the brightness of more than one diffraction spot at different positions can be detected automatically. The TV camera 5 is used, as explained above, to select a plurality of diffraction spots to be analyzed and their coordinate data are specified by the position specifying means 6 and outputted to be stored in the memory means 8. The stored coordinate data are retrieved and outputted to the position control means 7. The position control means 7 controls the motion of the X-Y stage 4, as explained above with reference to FIG. 1, to move the photoelectric converter 2 relative to the fluorescent screen 1 successively to the specified detection positions. Since the memory means 8 is adapted to store coordinate data on a plurality of specified positions, it is possible to specify a plurality of diffraction spots in one single input operation and automatically obtain images showing the distribution of a plurality of crystal grains by causing the coordinate data to be outputted successively in response to an end signal indicating the end of each scan by the electron beam over the image screen.

Detectors according to the third embodiment of the invention, too, comprise two independent detecting means for selecting diffraction spots to be analyzed on the fluorescent screen and detecting the brightness of these selected diffraction spots, and hence are capable of receiving brightness-indicating signals continuously and thereby improving the scan speed of the electron beam.

FIGS. 7, 8 and 9 are referenced next to describe still another detector for diffracted electrons according to a fourth embodiment of the invention. As shown in FIG. 7, this detector is similar to the one according to the third embodiment of the invention described above with reference to FIG. 6 but is different in that it includes, connected between its position specifying means 6 and position control means 7, a first memory means 10, a distance calculating means 11, a sequence selecting means 12 and a second memory means 13 such that the total distance by which the photoelectric converter 2 is moved by the X-Y stage 4 can be minimized.

As explained above with reference to detectors according to the first, second and third embodiments of the invention, diffraction spots are selected by using image signals from the TV camera 5, and coordinate data of the selected diffraction spots are specified through the position specifying means 6 and outputted to the first memory means 10 to be temporarily stored therein. These coordinate data are outputted to the distance calculating means 11 which uses them to calculate the distances L between pairs of the specified diffraction spots from their coordinate data stored in the memory means 10. The sequence selecting means 12 then uses these distances to determine a sequence in which the photoelectric converter 2 should be moved from one to the next of all of the selected diffraction spots to be analyzed such that the total distance travelled to scan all the spots to be analyzed can be minimized. The sequence thus determined and the corresponding coordinate data are stored in the second memory means 13, and the position control means 7 drives the X-Y stage 4 according to control signals from the second memory means 13 to move the photoelectric converter 2 relative to the fluorescent screen 1 from one selected spot to the next according to the selected sequence to thereby carry out a scan.

The procedure, carried out by the distance calculating means 11 and the sequence selecting means 12 as described above, is explained next with reference to FIGS. 7 and 8. First, the coordinate data stored in the first memory means 10 are read into the distance calculating means 11 (Step S1) and the distances L between pairs of positions specified by the position specifying means 6 are calculated by using these data retrieved from the first memory means 10 (Step S2). Next, combinations of movements from one to another of the positions specified by the position specifying means 6 are considered (Step S3). Suppose, for example, that three points A1, A2 and A3 have been specified by the position specifying means 6 as shown in FIG. 9, wherein the arrows schematically indicate how the screen may be scanned. In this example, there are the following six combinations of movements to be considered in order to scan these three points: A1→A2→A3, A1→A3→A2, A2→A1→A3, A2→A3→A1, A3→A1→A2, and A3→A2→A1. Next, the total distance of travel corresponding to each of the combinations considered in Step 3 is calculated (Step S4), and the shortest of these total distances of travel is determined by comparing them (Step S5). Finally, the sequence of movements corresponding to this shortest total distance is identified (Step S6). Thus, a detector according to the fourth embodiment of the invention is capable of diminishing the travel time of the X-Y stage 4 and hence the overall scanning time.

FIG. 10 shows still another detector for diffracted electrons according to a fifth embodiment of the invention, which is similar to the one described above with reference to FIG. 6 but is different in that it includes, connected between its position specifying means 6 and position control means 7, a brightness detecting means 14, a comparator 15, a spot selecting means 17 and a memory means 19, the comparator 15 being connected also to a standard setting means 16 and the spot selecting means 17 being connected also to an input means 18. Detectors according to this embodiment are for automatically selecting candidate diffraction spots, or automatically identifying those diffraction spots with brightness greater than a certain standard brightness value such that spots to be detected can be selected from such brighter ones of diffraction spots.

With reference still to FIG. 10, image signals of the fluorescent screen 1 outputted from the TV camera 5 are received by the brightness detecting means 19 which extracts brightness information therefrom and outputs it to the comparator 15. A standard brightness value is already inputted into the comparator 15 from the standard setting means 16, and the comparator 15 functions to compare the brightness information outputted from the brightness detecting means 14 with the stored standard brightness value. If the brightness represented by this brightness information is higher than the earlier inputted standard brightness value, the corresponding spot is determined to be a candidate and this determination is outputted to the spot selecting means 17 which serves through the input means 14 to select diffraction spots to be analyzed out of these candidate spots.

In order to make it easier for the operator to select diffraction spots to be analyzed, the spot selecting means 17 may be programmed to display icons or the like on a display screen (not shown) to indicate the positions of candidate spots such that diffraction spots to be analyzed can be selected through the input means 18 by indicating the displayed icons corresponding to the spots to be selected. Alternatively, different symbols may be caused to be displayed on the display screen corresponding to the individual candidates such that the operator can select diffraction spots to be analyzed by inputting the corresponding symbols through the input means 18.

The coordinate data of the diffraction spots selected by the spot selecting means 17 are stored in the second memory means 19. Thereafter, the position control means 7 operates the X-Y stage 4 according to control signals from the memory means 19 to move the photoelectric converter 2 relative to the fluorescent screen 1 for scanning the selected diffraction spots, as described above with reference to detectors according to other embodiments of the invention.

FIG. 11 shows still another detector according to a sixth embodiment of the invention, which is different from the detector described above with reference to FIG. 10 in that the input means 18 is not included but that the spot selecting means 17 is programmed to select every spot with brightness higher than the standard brightness value set through the standard setting means 16 and to output their coordinate data to the memory means 19.

The invention has been described above as applied to a reflecting type of scanning electron diffraction microscope but detectors according to the present invention can be applied also to scanning electron diffraction microscopes of a transmitting type. It is also to be emphasized that the examples described above are intended to illustrate the invention, and not to limit the invention. In particular, the various components of the detectors according to the present invention, referred to above merely as means for performing specified functions, are intended to be broadly construed. Examples of position specifying means and spot selecting means include combinations of a cathode ray tube, a cursor-displaying circuits, a mouse or a tracking ball; examples of position control means include driving circuits for a stepping motor and pulse counters; examples of memory means include random-access memories; examples of calculating means include central processing units; examples of brightness detecting means include a combination of an analog-to-digital converter and an image memory; and examples of input means include keyboards.

All modifications and variations on the illustrated examples that may be apparent to a person skilled in the art are intended to be within the scope of the invention. The main advantages to be gained by the present invention include the following:

(1) Since the detecting means is moved so as not to cover the fluorescent screen, diffraction spots can be accurately and easily selected;
(2) Signals indicative of the brightness of diffraction spots can be detected continuously such that the scanning speed of the electron beam can be increased;
(3) If it is the optical fiber, rather than the photoelectric converter to which it is connected, that is to be moved by the X-Y stage, the moving components of the detector can be made smaller and lighter;
(4) A plurality of scanning images can be taken automatically;
(5) Diffraction spots to be scanned can be automatically selected; and
(6) Since the X-Y stage can be moved from one to another of selected diffraction spots in an optimum sequence (according to a given criterion), the time required for moving the X-Y stage, as well as the overall time required for the scanning, can be reduced.

What is claimed is:

1. A detector for detecting electrons diffracted by a sample irradiated with an electron beam, said detector comprising:
   a fluorescent screen for converting a diffracted electron beam into optical signals;
   camera means for receiving optical signals from said fluorescent screen and thereby outputting image signals indicative of a diffraction pattern formed on said fluorescent screen;

detecting means for receiving optical signals from a specified position on said fluorescent screen and thereby detecting brightness of said specified position;

moving means for moving said detecting means relative to said fluorescent screen;

position specifying means for outputting position data indicative of a position on said fluorescent screen; and control means for controlling said moving means according to position data outputted from said position specifying means.

2. The detector of claim 1 wherein said moving means prevents said detecting means from interfering with the receipt of said optical signals from said fluorescent screen by said camera means.

3. The detector of claim 1 wherein said detecting means includes a photoelectric converter and an elongated flexible light-conducting means having a light-receiving end and an opposite end connected to said photoelectric converter, said moving means being adapted to move said light-conducting means relative to said fluorescent screen.

4. The detector of claim 3 further comprising a memory means for storing position data on a plurality of positions specified through said position specifying means.

5. The detector of claim 3 further comprising:
a first memory means for storing position data on a plurality of positions specified through said position specifying means;
a calculating means for receiving said stored position data from said first memory means and thereby calculating distances between pairs of said positions specified through said position specifying means;
a sequence selecting means for combining said calculated distances and thereby selecting, according to a specified criterion, a sequence of said selected positions in which said control means is to said moving means; and
a second memory means for storing said selected sequence;
said control means moving said moving means from one to another of said selected positions in said selected sequence.

6. The detector of claim 5 wherein said first memory means, said calculating means, said sequence selecting means and said second memory means are connected sequentially between said position specifying means and said control means.

7. The detector of claim 5 further comprising:
a standard brightness setting means for setting a standard brightness value;
a brightness detecting means for receiving said image signals from said camera means, extracting from said image signals brightness data indicative of the brightness of positions on said fluorescent screen, and outputting said brightness data;
a comparator means for receiving said brightness data outputted from said brightness detecting means, and indicating candidate positions where the brightness indicated by said brightness data is greater than said standard brightness value set by said standard brightness setting means;

a spot selecting means for selecting one or more target positions for analysis from said candidate positions indicated by said comparator;
a memory means for storing position data indicating positions of said target positions selected through said spot selecting means; and
control means controlling said moving means according to said target positions.

8. The detector of claim 7 further comprising an input means for allowing an operator to specify one or more of said candidate positions, said spot selecting means selecting the position specified through said input means as said target position.

9. The detector of claim 3 further comprising:
a standard brightness setting means for setting a standard brightness value;
a brightness detecting means for receiving said image signals from said camera means, extracting from said image signals brightness data indicative of the brightness of positions on said fluorescent screen, and outputting said brightness data;
a comparator means for receiving said brightness data outputted from said brightness detecting means, and indicating candidate positions where the brightness indicated by said brightness data is greater than said standard brightness value set by said standard brightness setting means;
a spot selecting means for selecting one or more target positions for analysis from said candidate positions indicated by said comparator;
a memory means for storing position data indicating positions of said target positions selected through said spot selecting means; and
control means controlling said moving means according to said target positions.

10. The detector of claim 9 further comprising an input means for allowing an operator to specify one or more of said candidate positions, said spot selecting means selecting the position specified through said input means as said target position.

11. The detector of claim 9 wherein said spot selecting means selects all of said candidate positions as said target positions for analysis.

12. The detector of claim 1 further comprising a memory means for storing position data on a plurality of positions specified through said position specifying means.

13. The detector of claim 4 wherein said memory means is connected between said position specifying means and said control means.

14. The detector of claim 1 further comprising:
a first memory means for storing position data on a plurality of positions specified through said position specifying means;
a calculating means for receiving said stored position data from said first memory means and thereby calculating distances between pairs of said positions specified through said position specifying means;
a sequence selecting means for combining said calculated distances and thereby selecting, according to a specified criterion, a sequence of said selected positions in which said control means is to move said moving means; and
a second memory means for storing said selected sequence;

said control means moving said moving means from one to another of said selected positions in said selected sequence.

15. The detector of claim 14 wherein said sequence selecting means selects said sequence such that the total distance traveled by said moving means to said selected positions is minimized.

16. The detector of claim 14 further comprising:
a standard brightness setting means for setting a standard brightness value;
a brightness detecting means for receiving said image signals from said camera means, extracting from said image signals brightness data indicative of the brightness of positions on said fluorescent screen, and outputting said brightness data;
a comparator means for receiving said brightness data outputted from said brightness detecting means, and indicating candidate positions where the brightness indicated by said brightness data is greater than said standard brightness value set by said standard brightness setting means;
a spot selecting means for selecting one or more target positions for analysis from said candidate positions indicated by said comparator;
a memory means for storing position data indicating positions of said target positions selected through said spot selecting means; and
control means controlling said moving means according to said target positions.

17. The detector of claim 16 further comprising an input means for allowing an operator to specify one or more of said candidate positions, said spot selecting means selecting the position specified through said input means as said target position.

18. The detector of claim 1 further comprising:
a standard brightness setting means for setting a standard brightness value;
a brightness detecting means for receiving said image signals from said camera means, extracting from said image signals brightness data indicative of the brightness of positions on said fluorescent screen, and outputting said brightness data;
a comparator means for receiving said brightness data outputted from said brightness detecting means, and indicating candidate positions where the brightness indicated by said brightness data is greater than said standard brightness value set by said standard brightness setting means;
a spot selecting means for selecting one or more target positions for analysis from said candidate positions indicated by said comparator;
a memory means for storing position data indicating positions of said target positions selected through said spot selecting means; and
control means controlling said moving means according to said target positions.

19. The detector of claim 18 further comprising an input means for allowing an operator to specify one or more of said candidate positions, said spot selecting means selecting the position specified through said input means as said target position.

20. The detector of claim 18 wherein said spot selecting means selects all of said candidate positions as said target positions for analysis.

* * * * *